(12) United States Patent
Robinson et al.

(10) Patent No.: US 6,963,297 B2
(45) Date of Patent: Nov. 8, 2005

(54) DELTA-SIGMA DIGITAL-TO-ANALOG CONVERTER ASSEMBLY

(75) Inventors: Ian Robinson, Venice, CA (US); Frank Winter, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/706,723

(22) Filed: Nov. 12, 2003

(65) Prior Publication Data

US 2005/0099327 A1 May 12, 2005

(51) Int. Cl.⁷ ............................................... H03M 3/00
(52) U.S. Cl. ...................................... 341/143; 341/144
(58) Field of Search ................................. 341/143, 144

(56) References Cited

U.S. PATENT DOCUMENTS

| | | | |
|---|---|---|---|
| 5,621,675 A | 4/1997 | Linz et al. | |
| 5,646,621 A | 7/1997 | Cabler et al. | |
| 5,654,711 A | 8/1997 | Fujimori | |
| 5,751,615 A | 5/1998 | Brown | |
| 5,995,030 A | 11/1999 | Cabler | |
| 6,028,544 A | * 2/2000 | Zarubinsky et al. | 341/143 |
| 6,191,715 B1 | 2/2001 | Fowers | |
| 6,291,924 B1 | 9/2001 | Lau et al. | |
| 6,317,468 B1 | 11/2001 | Meyer | |
| 6,323,795 B1 | 11/2001 | Yang et al. | |
| 6,408,318 B1 | 6/2002 | Fang et al. | |
| 6,587,060 B1 | * 7/2003 | Abbey | 341/143 |
| 6,646,581 B1 | * 11/2003 | Huang | 341/143 |
| 6,693,573 B1 | * 2/2004 | Linder | 341/143 |
| 2003/0017931 A1 | 9/2003 | Gupta et al. | |
| 2004/0222870 A1 | 11/2004 | Ueda et al. | |

FOREIGN PATENT DOCUMENTS

| | | |
|---|---|---|
| EP | 0 878 903 A2 | 11/1998 |
| EP | 1 453 197 A1 | 9/2004 |
| WO | WO 03/050949 | 6/2003 |

OTHER PUBLICATIONS

Yonghong Gao, et al.: "A Fifth–Order Comb Decimation Filter for Multi–Standard Transceiver Applications"; Circuits and Systems, 2000 Proceedings, ISCAS 2000 Geneva, The 2000 IEEE International Symposium on May 28–31, 2000, Piscataway, NJ USA, IEEE, vol. 3, May 28, 2000 (May 28, 2000), pp. 89–92, XP010502474, ISBN: 0-7803-5482-6 paragraph 0002; Figure 4a.

Maulik PC et al.; "A 16–Bit 250–KHZ Delta–Sigma Modulator and Decimation Filter"; IEEE Journal of Solid–State Circuits, IEEE Inc, New York, US, vol. 35, No. 4, Apr. 2000 (Apr. 4, 2000), pp. 458–466, XP001009165, ISSN:0018–9200; abstract.

(Continued)

Primary Examiner—Peguy JeanPierre
Assistant Examiner—Joseph Lauture
(74) Attorney, Agent, or Firm—Tarolli, Sundheim, Covell & Tummino L.L.P.

(57) ABSTRACT

Systems and methods are provided for converting a digital signal into an analog signal. A digital-to-analog converter assembly comprises a delta-sigma modulator, a digital-to-analog converter, an analog filter, and a comb filter. The delta-sigma modulator processes a digital input signal to produce a digital output signal having at least one associated high dynamic range frequency band. The digital-to-analog converter converts the digital output signal into an analog output signal having at least one associated high dynamic range frequency band. The associated high dynamic range bands have respective frequency characteristics. An analog filter assembly filters the analog signal. The analog filter has at least one passband. A comb filter assembly attenuates the analog signal output of the filter assembly to improve signal to noise ratio.

26 Claims, 5 Drawing Sheets

OTHER PUBLICATIONS

Birru D: *"Use of Comb Filters for Efficient VLSI Implementation of Reduced Clock Frequency Noise Shapers"*; Electronics Letters, IEE Stevenage, GB, vol. 32, No. 14, Jul. 4, 1996 (Jul. 4, 1996), pp. 1268–1270, XP006005385, ISSN: 0013–5194, abstract.

Adler E L: *"Surface Acoustic Wave Devices Fundamentals, Current Status, and Future Trends"*; NPL. May 17, 1994 (May 17, 1994), pp. 18–18, XP010269729 Canada; the whole document.

S.R. Norsworthy, R.Schreier, G.C. Temes: *"Delta–Sigma Data Converters"*; 1997, Wiley–Interscience, United States of America, XP002322216; pp. 309–313, 406–408, 410–421, 197–199, 442–445, 390–394.

Chu S et al: *"Multirate Filter Designs using Comb Filters"*; IEEE Transactions on Circuits and Systems, IEEE Inc. New York, US, vol. CAS–31, No. 11, Nov. 1984 (Nov. 1984), pp. 913–924, XP002049419 paragraph 0111.

Abu–Al–Saud W A et al: *"Modified CIC Filter for Sample Rate Conversion in Software Radio Systems"*; IEEE Signal Processing Letters IEEE USA, vol. 10, No. 5, May 5, 2003 (May 5, 2003), pp. 152–154; XP002322375 ISSN: 1070–9908, figure 1.

Galton I: *"Delta–Sigma Data Conversion in Wireless Transceivers"* IEEE Transactions on Microwave Theory and Techniqus, IEEE USA, New York, US, vol. 50, No. 1, part 2, Jan. 2002 (Jan. 2002), pp. 302–315, XP001085552 ISSN: 0018–9480, paragraph 0001.

Hurst P J et al: *"Finite Impulse Response Switched–Capacitor Filters for the Delta–Sigma Modulator D/A Interface"*; IEEE Transactions on Circuits and Systems, IEEE Inc. New York, US, vol. 38, No. 11, Nov. 1991(Nov. 11, 1991) , pp. 1391–1397, CP000270297, figure 2.

\* cited by examiner

DELTA-SIGMA DIGITAL-TO-ANALOG CONVERTER ASSEMBLY

TECHNICAL FIELD

The present invention relates generally to communications systems, and more specifically to digital-to-analog converters.

BACKGROUND OF THE INVENTION

Efforts in the design of integrated circuits for radio frequency (RF) communication systems generally focus on improving performance, reducing cost or a combination thereof. One area of increasing interest relates to conversion of signals, such as from analog-to-digital or digital-to-analog. Both types of conversion have benefited from the development and use of delta-sigma modulation.

Delta-sigma modulation is a technique used to generate an estimate of a signal using a small number of quantization levels and a very high sampling rate. Limiting a signal to a finite number of levels introduces significant "quantization" noise into the system. Oversampling and the use of an integrator feedback-loop in delta-sigma modulation are effective in shifting quantization noise to out-of-band frequencies. The noise shifting properties enable efficient use of subsequent filtering stages to remove noise and produce a more precise representation of the input.

The filters within a delta-sigma modulator provide a noise transfer function (NTF) and a signal transfer function. The poles and zeroes of the NTF determine the shape and depth of low noise regions output by the modulator. The use of a delta-sigma modulator in a digital-to-analog conversion can produce an analog signal having a high dynamic range, but only for limited ranges of frequency. Outside of the narrow frequency bands having a high dynamic range, a delta-sigma modulated noise increases sharply. In effect, the delta-sigma modulator trades the majority of its spectral range for a few regions of high dynamic range operation. It is not generally possible to design the location and number of zeroes in the NTF to simultaneously control the width and depth of the high dynamic range (low noise) region(s) and the slope of the rise in noise at frequencies bordering the low noise region. Increased bandwidth can be achieved at the expense of higher order filters requiring additional circuitry and/or increased sample rates (which may require expensive materials such as Silicon Germanium or Indium Phosphide. An analog filter is required to remove the quantization noise from the out of band regions. It can be difficult and expensive to provide a filter that can respond to the rapid rise in noise at the boundaries of the high dynamic range regions without restricting the useful bandwidth of the signal.

SUMMARY OF THE INVENTION

In accordance with one aspect of the present invention, a digital-to-analog converter assembly comprises a delta-sigma modulator, a digital-to-analog converter, an analog filter, and a comb filter. The delta-sigma modulator processes a digital input signal to produce a digital output signal having at least one associated high dynamic range frequency band. The digital-to-analog converter converts the digital output signal into an analog output signal having at least one associated high dynamic range frequency band. The associated high dynamic range bands have respective frequency characteristics. An analog filter assembly filters the analog signal. The analog filter has at least one passband. An analog comb filter assembly attenuates the output of the filter assembly to improve signal to noise ratio.

In accordance with another aspect of the invention, a method is provided for converting a digital input signal, having a first word size, into an analog output signal. The digital input signal is quantized to produce a digital output signal having a second word size. The first word size is larger than the second word size. The digital input signal is processed to shift noise associated with quantizing the digital input signal away from at least one frequency band of interest. It will be appreciated that this processing can precede the quantization of the signal. The digital output signal is converted into an analog signal. A delayed representation of the analog signal is produced, and the analog signal and the delayed representation are summed. The summed analog signal is then filtered to produce an analog output substantially free of quantization noise.

DETAILED DESCRIPTION OF INVENTION

The present invention relates to systems and methods for converting a digital input signal into an analog output signal that is substantially free from quantization noise. In accordance with an aspect of the invention, a digital input signal is converted to an analog output signal at a delta-sigma digital-to-analog converter (DAC). The delta-sigma DAC will have an associated high dynamic range frequency band. The high dynamic range frequency band will have boundary regions in which the signal quickly degenerates into quantization noise (e.g., the dynamic range of the signal decreases sharply with distance from the high dynamic range band). It can be difficult to provide a filter with sufficient discrimination to attenuate the quantization noise at these boundaries to acceptable levels without attenuating signals and frequencies of interest as well. To this end, a comb filter is used to attenuate noise within boundary regions of the high dynamic range band as to reduce the rate of signal degeneration at the boundaries. This allows for a filter with a more gradual response to be used to filter quantization noise in the out-of-band regions of the signal.

Figure 1:
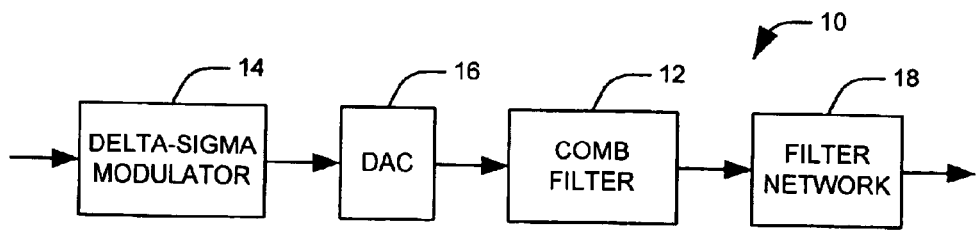
FIG. 1 illustrates a delta-sigma digital-to-analog converter utilizing a comb filter assembly in accordance with an aspect of the present invention.

FIG. 1 illustrates a delta-sigma digital-to-analog converter (DAC) assembly 10 utilizing a comb filter in accordance with one aspect of the present invention. The comb filter 12 reduces noise associated with a delta-sigma modulated signal to broaden one or more high dynamic range regions associated with a delta-sigma modulator 10. It will be appreciated that the described comb filter 12 can be practiced with any delta-sigma modulator, including both delta-sigma modulators having relatively constant frequency properties and frequency agile delta-sigma modulators in accordance with one or more aspects of the present invention.

In accordance with an aspect of the invention, a digital signal is received at a delta-sigma modulator 14. The digital signal will be a multi-bit digital signal having an associated word size. The delta-sigma modulator 14 quantizes the received signal to produce a representation of the signal having a reduced word-size. The quantization noise produced by this quantization is shifted by the delta-sigma modulator to frequencies outside of various frequency bands of interest to produce one or more high dynamic range regions within the digital signal. The high dynamic range frequency bands produced by the delta-sigma modulator comprise a narrow low-noise center band located between two boundary areas characterized by a rapid decrease in dynamic range.

The digital signal is provided to a digital-to-analog converter 16. The digital-to-analog converter 16 produces an analog signal corresponding to the input digital signal. The analog signal will contain the one or more high narrow dynamic range regions produced by the delta-sigma modulator 14 as well as a large amount of out-of-band quantization noise. While this quantization noise can be filtered from the analog signal via a filter network 18, the rapid increase of noise within the boundary areas requires a filter having an extremely sharp cut-on and cut-off response within the narrow frequency range defined by the boundaries. To maximize the available bandwidth, the filter requires an associated frequency response such that the frequencies at the exterior portions of the boundary regions are greatly attenuated, while the frequencies at the interior portions of the boundary regions are minimally attenuated. It will be appreciated that providing a filter with such an extreme variance in response over a narrow frequency range is difficult and cost-intensive at best.

To simplify the filtering operation, the analog signal is provided to the comb filter 12. The comb filter 12 combined the analog signal with a delayed representation of itself in order to produce a periodic series of narrow attenuated regions (e.g., the zeroes of the comb filter) within the frequency spectrum of the analog signal. Through careful selection of the delay associated with the comb filter 12, the period of the attenuated regions can be tuned to coincide with the boundary regions, reducing the demands on the analog filter network 18. In effect, the comb filter assembly shapes the high dynamic range regions produced by the delta-sigma modulator 14 to match the passband of a desired filter response. Once the signal has been attenuated at the comb filter 12, it is provided to the filter network 18. The filter network 18 includes one or more passbands that correspond with the high dynamic range regions of the analog signal. The filter network 18 filters the quantization noise from the out-of-band regions and outputs a high dynamic range signal.

Figure 2:
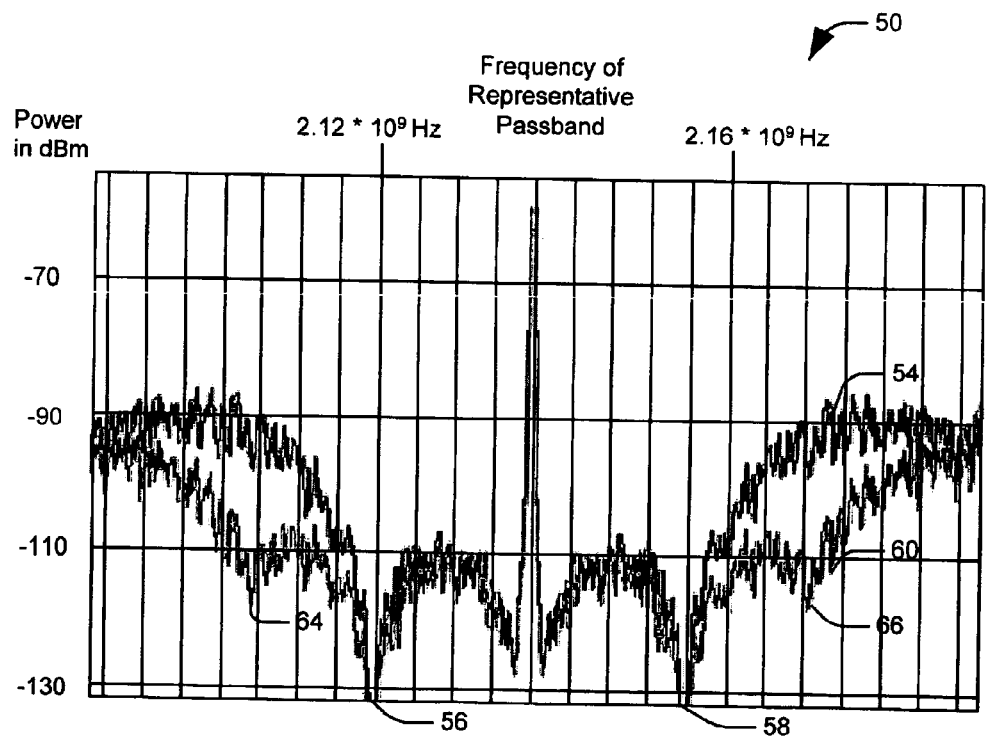
FIG. 2 is a graph of power versus frequency illustrating a change in the output analog signal produced by the comb filter along a representative frequency band for an exemplary delta-sigma DAC.

FIG. 2 is a graph of power versus frequency that illustrates a change in the output analog signal produced by the comb filter along a representative frequency band 50 for an exemplary delta-sigma DAC. The uncorrected output of the delta-sigma DAC 54 maintains a high dynamic range (e.g., noise less than −110 dBm) for a narrow band of around forty MHz, with very high dynamic range (e.g., −130 dBm) nulls 56 and 58 marking the boundaries of the region. A property of this delta-sigma modulation is the rapid increase in the noise level beyond these two nulls 56 and 58; the dynamic range of the delta sigma modulator decreases by 40 dBm to −90 dBm within fifteen MHz of the nulls.

It will be appreciated that there are practical limits to analog filters. The ideal filter is the "brickwall" filter, in which the passband is not attenuated and the area outside the passband is attenuated to a desired amount (e.g., the signal experiences a gain near zero for frequencies outside the passband). Current analog bandpass filters require a certain amount of "roll-on" and "roll-off" to either side of the passband, in which the signal is attenuated, but by amount less than the desired amount. Where a signal degrades quickly at the boundary of the passband, it is necessary to have a very steep roll-n and roll-off for the filter to account for the rapid increase in the amplitude of the noise. Filters with these characteristics, where it is possible to design them, are expensive to design and build.

In accordance with an aspect of the invention, the converted signal can be provided to a comb filter to reduce the performance demands on the bandpass filter. The comb filter retards the rapid increase in noise at the boundaries of the passband of interest associated with delta-sigma signal conversion. A comb-filtered signal 60 behaves similarly to the uncorrected signal 54 in the frequency band between the two nulls 56 and 58. For frequencies beyond this region, the comb filtered signal shows a marked decrease in the rate of noise increase, reaching the −90 dBm level only at frequencies over thirty-five MHz from the nulls. The comb filter, in effect, adds two minor nulls 64 and 66 just outside of the high dynamic range region that act to widen the region. In the illustrated example, the minor nulls 64 and 66 can be found about fifteen MHz outside of the high dynamic range region, and serve to maintain a region of high dynamic range (e.g., around −110 dBm) for the fifteen MHz encompassed by the minor null (e.g., 64) and its corresponding very high dynamic range null (e.g., 56). The addition of these nulls relaxes the filter response required from the analog filter, allowing the use of a more gradual cut-off and a wider passband.

Figure 3:
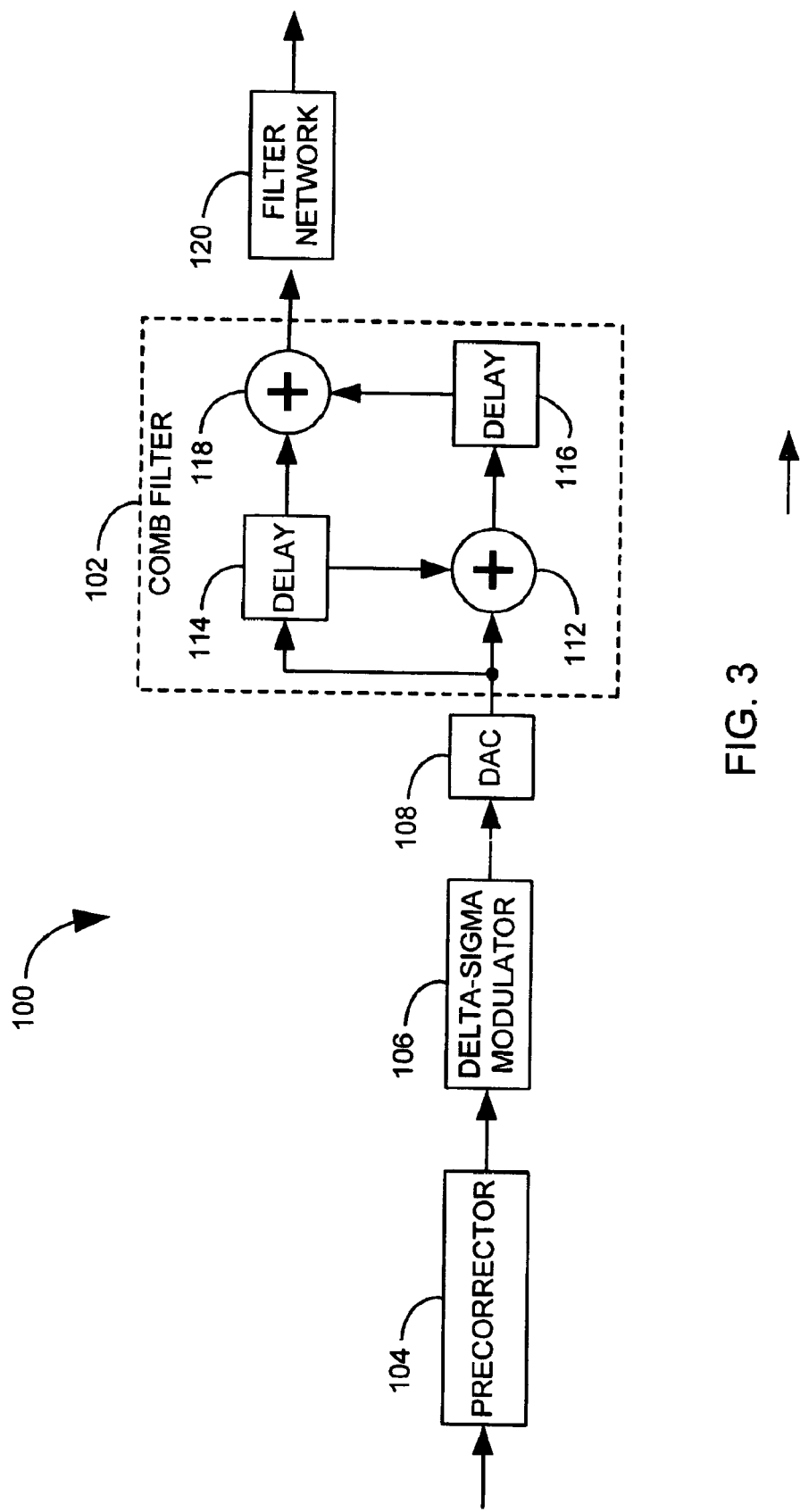
FIG. 3 illustrates an exemplary delta-sigma DAC utilizing a comb filter assembly in accordance with an aspect of the present invention.

FIG. 3 illustrates an exemplary delta-sigma DAC assembly 100 utilizing a comb filter assembly 102 in accordance with an aspect of the present invention. The exemplary delta-sigma DAC assembly 100 includes a digital precorrector 104 to mitigate the attenuating effect of the comb filter 102 on one or more signals of interest. The digital precorrector 104 can optionally boost a desired frequency range of the digital signal as to counteract the attenuation of that range by the comb filter 102.

A digital signal is provided to the precorrector 104. The digital precorrector 104 applies a correction approximating the inverse of a transfer function associated with the comb filter 102 to the digital signal at one or more frequency ranges associated with respective signals of interest. The position of the signals of interest within the digital signal can be provided to the precorrector 104 either as preprogrammed configuration data or dynamically through a system control (not shown). In an exemplary embodiment, the contribution of the digital precorrector 104 can be clipped to avoid exceeding a signal saturation level associated with the delta-sigma DAC assembly 100. The output of the precorrector is provided to a delta-sigma modulator 106. The delta-sigma modulator 106 filters and quantizes the signal to shift noise away from the frequency ranges associated with the signals of interest.

The output of the delta-sigma modulator 106 is provided to a digital-to-analog converter (DAC) 108. The digital-to-analog converter 108 converts the digital signals from the delta-sigma modulator 106 into analog signals. In an exemplary implementation of the invention, the output of the delta-sigma modulator 106 is a one-bit output, and the digital-to-analog converter 108 has a one-bit resolution. It will be appreciated, however, that both the output of the delta-sigma modulator 106 and the resolution of the digital-to-analog converter 108 can be multi-bit in accordance with one or more aspects of the present invention.

The analog signal is then provided to the comb filter 102. The comb filter 102 comprises one or more stages of filtering, each comprising a summer 112 and a delay component 114. In the illustrated exemplary implementation, a two-stage comb filter is shown, but it will be appreciated that a comb filter can comprise a single stage or more than two stages as well. The analog signal from the DAC is first split into two paths 108. A first path is provided directly to a first summer 112, while a second path is provided to a first delay 114. The output of the first summer 112 is also divided, with a first path being provided to a second summer 116 and a second path proceeding to a second delay 118. The output of the second delay 118 is provided to the second summer 116, which provides a final output. The delays will normally be set to different values, with each stage of the comb filter providing nulls or zeroes at a periodicity inversely proportional to the delay of the stage.

The first summer 112 sums the original signal with the output of the first delay 114. The output of the first summer 112 is then summed with a delayed representation of itself (e.g., the output of the second delay 116) at the second summer 118. The resulting signal contains two separate periodic series of narrow attenuated regions that can be adjusted to coincide with the one or more high dynamic range regions. The comb filter 102 provides a correction to the analog signal that serves to broaden the one or more high dynamic range frequency bands of the delta-sigma modulator 106. More precisely, the comb filter 102 attenuates the signals, if present, and noise at the boundaries of the high dynamic range frequency bands produced by the delta-sigma modulator 106 as to reduce the rate of decrease of the dynamic range of the delta-sigma modulator at these boundaries.

The output of the comb filter 102 is provided to an analog filter network 120. The filter network 120 filters the out-of-band quantization noise produced by the delta-sigma DAC and reconstructs a desired signal from the delta-sigma output. The filter network 120 can comprise one or more analog filters, a given filter having one or more associated passbands. It will be appreciated that the attenuation provided by the comb filter 102 allows for the use of a filter network having a more gradual frequency response at the boundaries of the high dynamic range regions. Accordingly, the passbands associated with the filter network 120 can have an associated frequency response selected to coincide with the widened high dynamic range regions provided by the delta-sigma modulator 106 and the comb filter 102.

Figure 4:
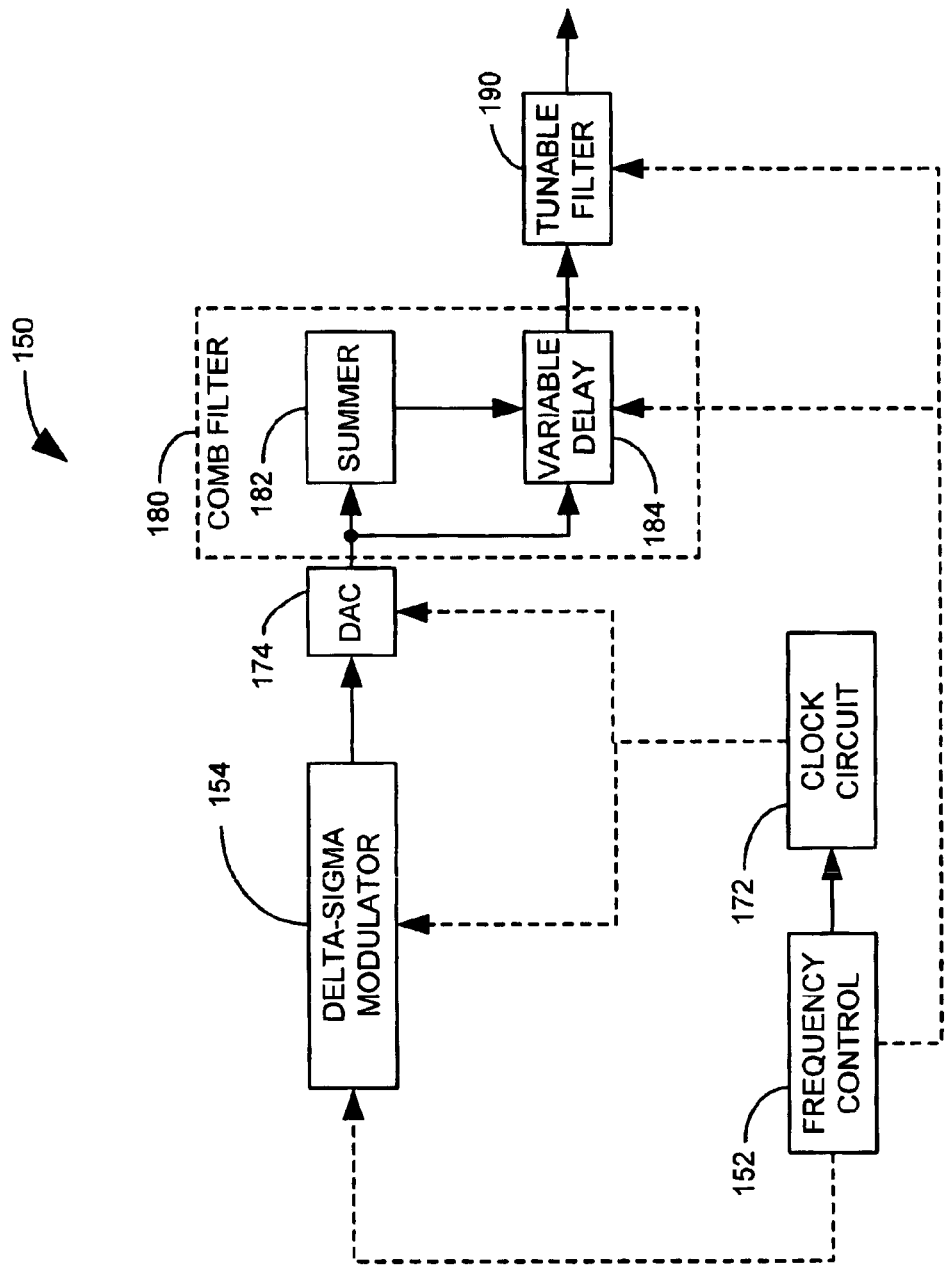
FIG. 4 illustrates an exemplary frequency agile delta-sigma analog-to-digital converter (DAC) incorporating a comb filter in accordance with an aspect of the present invention.

FIG. 4 illustrates an exemplary frequency agile delta-sigma analog-to-digital converter (DAC) assembly 150 in accordance with an aspect of the present invention. The illustrated delta-sigma DAC assembly 150 includes a frequency control 152 that allows the delta-sigma DAC assembly 150 to adjust to a number of different frequencies by adjusting either the clock rate or values associated with one or more components. These changes can occur in real time, allowing the delta-sigma DAC assembly 150 to be used for frequency hopping and frequency division schemes.

Turning to the operation of the illustrated assembly 150, a digital input signal is received at a delta-sigma modulator 154. The delta-sigma modulator 154 can comprise one or more stages, limited only by practical considerations. The delta-sigma modulator 154 first preprocesses the digital input signal, as to shape the quantization noise produced by a quantization function of the delta-sigma modulator 154 into frequencies outside of one or more bands of interest. It then quantizes the digital signal to produce a digital output signal having a smaller word size.

The delta-sigma modulator 154 provides one or more narrow high dynamic range frequency bands by shifting its associated quantization noise to out-of-band frequencies. The high dynamic range frequency bands associated with delta-sigma modulator 154 generally have center frequencies that are multiples of its clock rate. In an exemplary delta-sigma modulator, a center frequency of one high dynamic range band can be found at one-fourth of the clock rate. Thus, the position of these high dynamic range bands can be shifted across frequencies by changing the associated clock rate of the delta-sigma modulator 154.

To this end, the delta-sigma modulator 154 can be driven by a clock circuit 172 to produce its output at a selected sample rate. In an exemplary embodiment, the clock circuit can be a digital frequency synthesizer. The clock circuit 172 is controlled by the frequency control 152 to achieve a desired clock rate for the delta-sigma modulator 154. It will be appreciated that the frequency control 152 can be made responsive to user input, such that the center frequency of the delta-sigma DAC assembly 150 is programmable. Alternatively, the frequency control 152 can be made responsive to one or more digital processing components (not shown) on an exciter comprising the delta-sigma DAC assembly 150 as to provide dynamic control of the frequency characteristics of the delta-sigma DAC.

Additional frequency characteristics associated with the digital output of the delta-sigma modulator 154 can be altered directly by the frequency control 152. Registers in one or more filter components within the DSM can be programmable such that the scalar value associated with the register can be altered by a control signal from the frequency control 152. In the illustrated delta-sigma modulator 154, the feedback registers essentially act as digital filter coefficients. Altering these coefficients shifts the location of the zeros in the digital filter function represented by the delta-sigma modulator 154, changing the shape of the quantization noise across the frequency spectrum. Specifically, the width and dynamic range of a given high dynamic range band can be changed by shifting the number of and the placement of the one or more zeroes along the frequency spectrum.

The output of the delta-sigma modulator 154 is then provided to a digital-to-analog converter 174. The digital-to-analog converter 174 produces an analog output signal that corresponds to the digital output of the delta-sigma modulator 154. The digital-to-analog converter 174 can also be driven by the clock circuit 172, such that it operates at a rate corresponding to the rate of the delta-sigma modulator 154. The analog signal is provided to a comb filter 180. The comb filter 180 broadens the one or more high dynamic range bands associated with the analog signal to facilitate the filtering of out-of-band quantization noise associated with the signal. The illustrated comb filter 180 is a single stage comb filter. It will be appreciated that a multiple stage comb filter can also be utilized with the present invention.

Within the comb filter 180, the analog signal is split along two paths, with a first path proceeding directly to a summer 182, and a second path that is provided to the summer through a variable delay element 184. The signal output from the summer 182 includes periodic narrow regions of attenuation throughout the frequency spectrum. The period of this attenuation can be adjusted by increasing or decreasing the length of the delay associated with the variable delay element 184. This allows the comb filter 180 to be tuned, such that the regions of attenuation can coincide with respective boundary regions of the tuned high dynamic range regions. The attenuation regions can also be moved away from wanted signals, increasing the breadth of frequencies at which wanted signals can be placed. The comb filter 180 can receive control input from the frequency control defining the associated delay period of the variable delay element 184.

The output of the comb filter is then provided to a tunable filter 190. The tunable filter 190 attenuates signals having a frequency outside of one or more passbands associated with the filter. Each of the filter passbands has an associated center frequency that can be altered in response to a control signal from the frequency control 152. This allows the system to react to changes in the frequency of the analog output from the comb filter 180 by shifting the location of one or more passbands. The tunable filter 190 can comprise a bank of filters, each representing a desired passband of interest. Alternatively, the tunable filter 190 can comprise a surface acoustic wave (SAW) filter that can electronically controlled to configure one or more micromechanical components that define its one or more associated passband frequencies. Other tunable filters having similar frequency agility can be utilized in accordance with one or more aspects of the invention. The output of the tunable filter 190 is a clean analog signal at a desired frequency that can be amplified and broadcast according to known methods.

Figure 5:
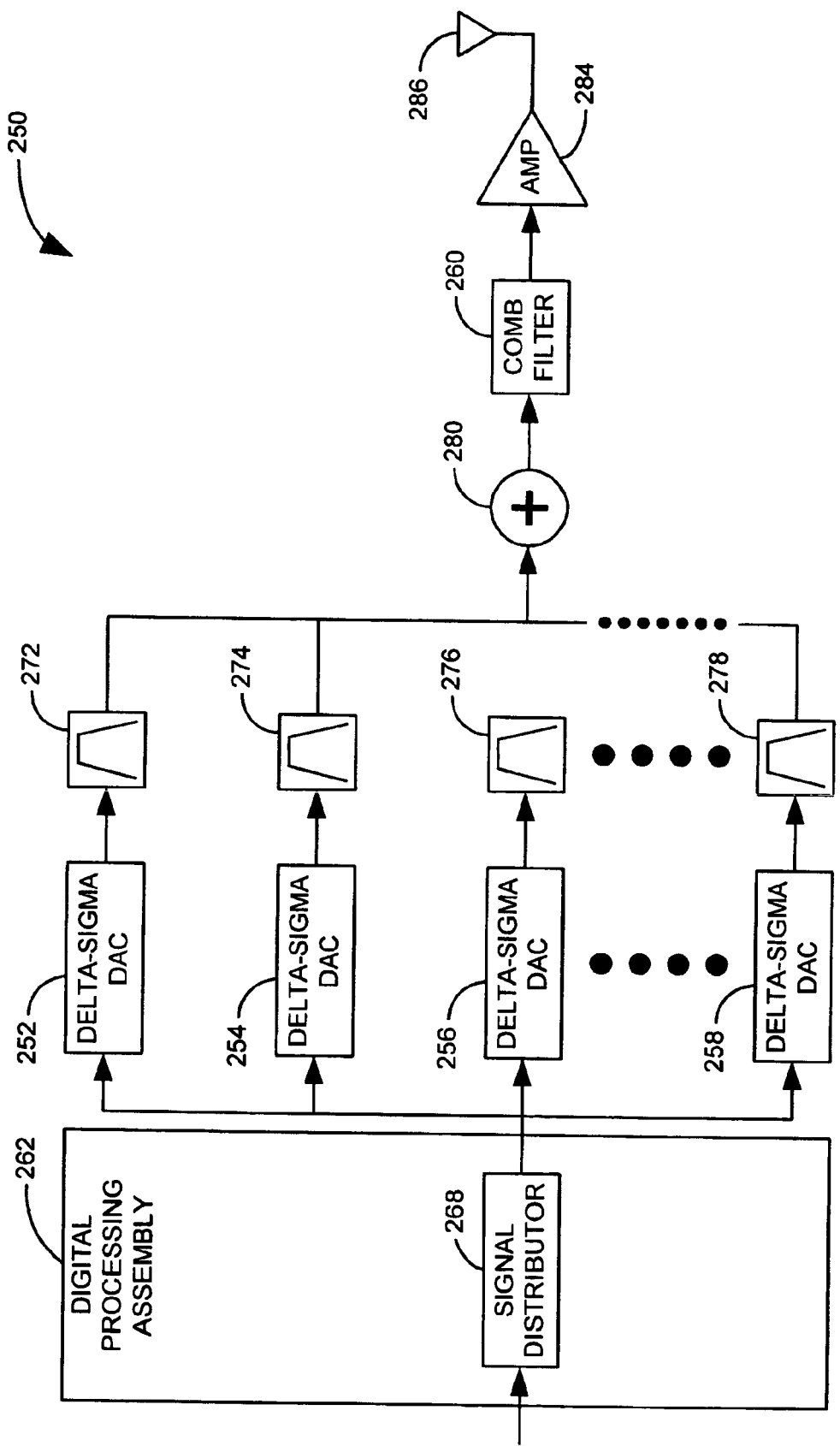
FIG. 5 illustrates an exemplary wideband transmitter system incorporating a plurality of delta-sigma digital-to-analog converters and a comb filter assembly in accordance with an aspect of the present invention.

FIG. 5 illustrates an exemplary wideband transmitter system 250 incorporating a plurality of delta-sigma digital-to-analog converters 252, 254, 256, and 258 and a comb filter assembly 260 in accordance with an aspect of the present invention. Each of the plurality of delta-sigma DACs (e.g., 252) is operative to convert a digital input signal into an analog output signal with minimal noise over a narrow region of high dynamic range operation. These high dynamic range regions can be distributed across the frequency spectrum, with each having a unique center frequency. In an exemplary implementation, the DACs 252, 254, 256, and 258 are designed or programmed to have low noise frequency bands that are adjacent within the frequency spectrum and of even width. The comb filter assembly 260 is tuned to provide attenuation at the boundaries between these high dynamic range regions to ensure that any area of overlap will not result in substantially increased quantization noise.

Turning to the illustrated system 250, a digital signal processing assembly 262 produces an information carrying digital signal. The digital signal processing assembly 262 includes modulators and a band selector and provides one or more modulated signals. The digital signal processing assembly 262 also includes a signal distributor 268 that distributes the digital baseband or IF signal to an appropriate one of the plurality of delta-sigma DACs (e.g., 252). Each signal is provided to one delta-sigma modulator and DAC (called a delta-sigma DAC). Each delta-sigma DAC (e.g., 254 and 256) has its own low noise spectral band. It converts the one or more input signals into respective analog signals at RF frequencies, which may be the final RF frequencies for transmission, within its low noise band. The aggregation of the DS DACs provides extremely wide bandwidth and high dynamic range. The digital signal processing assembly 262 can comprise further digital circuitry useful for producing the digital signal. For example, the digital processing assembly 262 can comprise control components for controlling and correlating the characteristic frequencies of the delta-sigma DACs 252, 254, 256, and 258 and the comb filter 260.

The analog outputs from the plurality of DACs 252, 254, 256, and 258 are provided to respective analog passband filters 272, 274, 276, and 278. A given passband filter (e.g., 272) attenuates noise outside of the high dynamic range frequency band of its respective DAC (e.g., 252). Accordingly, the output of each filter (e.g., 272) is an analog signal representing a portion of the original digital signal within the frequency range of its associated passband. It will be appreciated that a practical analog filter will not have a perfect "brick wall" response at the boundaries of its passband. Accordingly, there can be an appreciable amount of noise located at the boundaries of the filter passbands.

The analog signals output by the filters 272, 274, 276, and 278 are provided to a summer 280 that combines the signals into a composite analog signal. The composite analog signal comprises a low noise representation of the original digital, excepting areas of overlap between the high dynamic noise regions. Within these areas, the residual noise at the boundaries of each region can overlap to create unacceptable levels of noise.

Accordingly, the composite analog signal is provided to a comb filter 260 that is tuned to provide attenuation at the boundaries of the high dynamic range regions. This additional attenuation reduces the noise created by the overlapping frequency ranges to acceptable levels. The use of the comb filter 260 allows for high-resolution digital-to-analog conversion of a signal over a contiguous wide frequency band using only relatively inexpensive narrow band delta-sigma DACs. The comb-filtered signal is then provided to a high power amplifier 284 that amplifies the signal to an appropriate power level for transmission. The signal is then transmitted at an antenna 286. It is to be appreciated that the relative frequencies of the DS DAC passbands can take on many forms. They may overlap or form non-contiguous regions and can be of uneven width. The digital processing assembly 262 can provide inputs to the various DS DACs with relative delays to account for any propagation differences between the parallel channels (DS DAC and filter).

Figure 6:
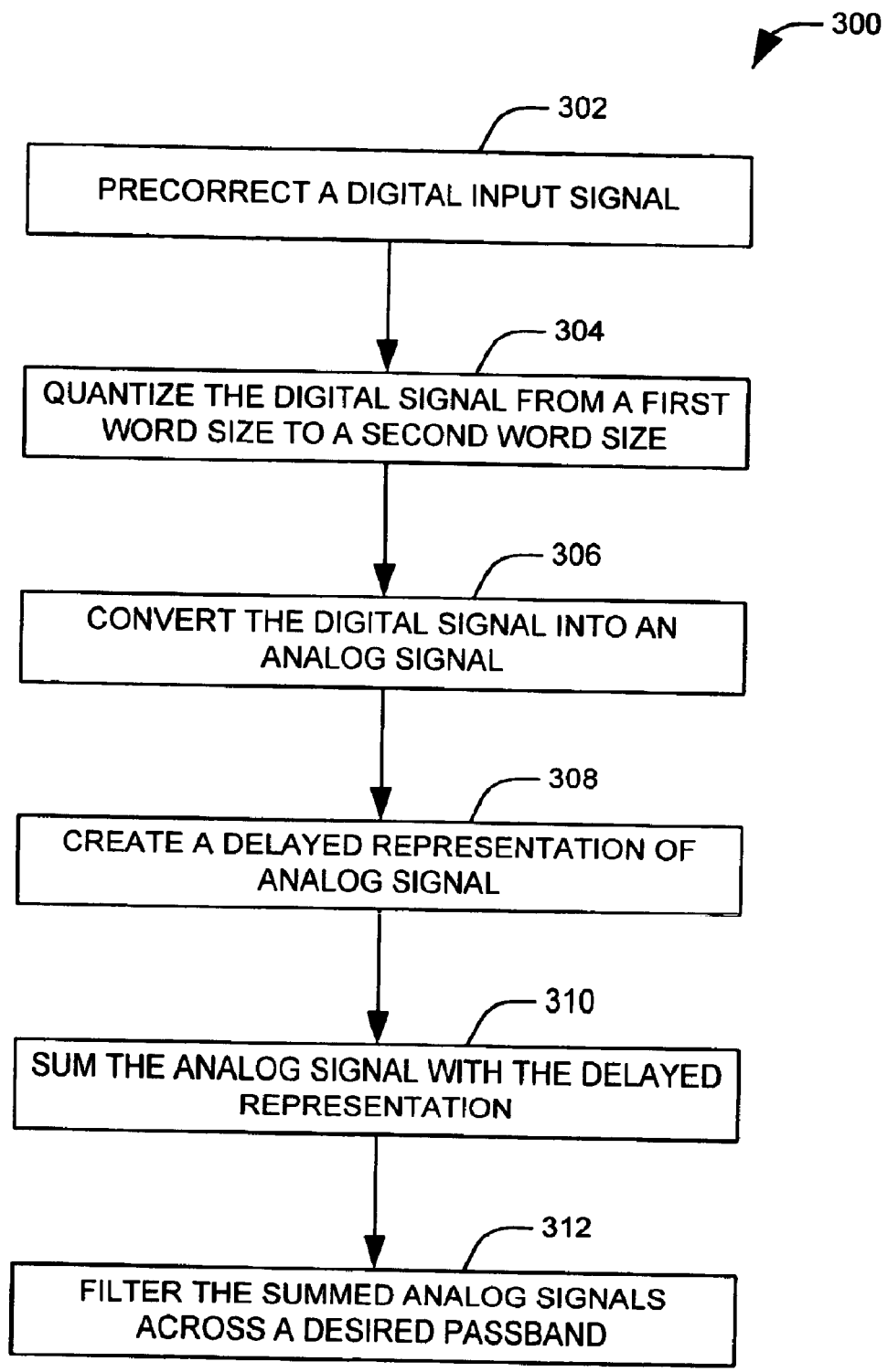
FIG. 6 illustrates a methodology for converting an analog signal into a digital signal in accordance with an aspect of the present invention.

In view of the examples shown and described above, a methodology in accordance with the present invention will be better appreciated with reference to the flow diagram of FIG. 6. While, for purposes of simplicity of explanation, the methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodologies can be implemented in hardware (e.g., one or more integrated circuits), software (e.g., running on a DSP or ASIC) or a combination of hardware and software.

FIG. 6 illustrates a methodology 300 for converting an analog signal into a digital signal in accordance with an aspect of the present invention. A digital input signal, having a first word size, is preprocessed at 302 to precorrect attenuation due to the comb filter. The signal is then quantized at 304 to reduce the digital input signal to a digital output signal having a second word size. In an exemplary embodiment, the second word size is one-bit.

At 306, the digital output signal is converted into an analog signal. The analog signal can include one or more high dynamic range frequency bands and a large amount of out-of-band quantization noise. At 308, the analog signal is split into two signal paths, with the second signal path passed through a delay element to create a delayed representation of the signal. The signals are summed at 310 to introduce a periodic attenuation into the analog signal. In an exemplary embodiment, the period of the delay is selected such that the periodic attenuation corresponds to the boundaries of the one or more high dynamic range regions of the analog signal. The signal is provided at 312 to an analog filter that filters the out-of-band quantization from the analog signal. The presence of the periodic attenuation allows the analog filter to maintain a practical frequency response in the boundary areas of the high dynamic noise regions of the analog signal while still maintaining an adequate level of performance.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A digital-to-analog converter assembly, comprising:
    a delta-sigma modulator that processes a digital input signal to produce a digital output signal having at least one high dynamic range frequency band;
    a digital-to-analog converter that converts the digital output signal into an analog output signal having the at least one high dynamic range frequency band;
    an analog filter assembly that filters the analog signal, the analog filter having at least one associated passband; and
    a comb filter assembly that attenuates the output of the analog filter assembly to provide a plurality of attenuating nulls and being tuned such that the attenuating nulls are centered at selected locations within the at least one high dynamic range frequency band of the analog output signal, such that the overall wanted signal to noise ratio of the system is improved.

2. The assembly of claim 1, the attenuating nulls being centered at respective boundaries of the at least one high dynamic range frequency band of the analog output signal such that a given high dynamic range region coincides with the passband of the analog filter assembly.

3. The assembly of claim 1, the comb filter comprising at least one delay element and at least one summer.

4. The assembly of claim 1, further comprising a digital precorrector that predistorts the digital input signal to increase the power of at least one signal of interest within the at least one high dynamic range frequency band as to mitigate the attenuation provided by the comb filter.

5. The assembly of claim 1, further comprising a frequency control that controls at least one of the analog filter, the comb filter, the delta-sigma modulator, and the digital-to-analog converter to alter frequency characteristics associated with the digital-to-analog converter assembly.

6. The assembly of claim 5, the frequency control altering respective duration associated with at least one delay element within the comb filter.

7. The assembly of claim 5, further comprising a clock circuit and the frequency control controlling the clock circuit to alter respective center frequencies of at least one high dynamic range region associated with the delta-sigma modulator.

8. The assembly of claim 1, the analog filter being a tunable filter, such that respective center frequencies of the at least one associated passband can be electronically altered.

9. The assembly of claim 8, the tunable filter comprising a surface acoustic wave (SAW) filter.

10. The assembly of claim 8, the analog filter comprising at least one micromechanical structure that can be electrically configured to change the center frequency of the at least one passband associated with the analog filter.

11. The assembly of claim 1, the comb filter comprising a plurality of delay elements and a plurality of summers.

12. The assembly of claim 1, comprising a plurality of delta-sigma modulators, a given delta-sigma modulator having a high dynamic range frequency band with an associated center frequency.

13. The assembly of claim 12, the high dynamic range frequency bands being adjacent, such that they collectively comprise a contiguous wide frequency band, the comb filter attenuating noise at the boundaries between the bands.

14. A method of converting a digital input signal into an analog output signal, comprising:
    quantizing a digital input signal, having a first word size, to produce a digital output signal having a second word size, the first word size being larger than the second word size;
    processing the digital input signal as to shift noise associated with quantizing the digital signal away from at least one frequency band of interest;
    converting the quantized digital output signal into an analog signal;
    producing a delayed representation of the analog signal;
    summing the analog signal and the delayed representation; and
    filtering the summed analog signal.

15. The method of claim 14, further comprising changing a shape associated with a frequency band of interest.

16. The method of claim 14, further comprising changing a center frequency associated with a frequency band of interest.

17. The method of claim 14, further comprising changing a delay associated with the production of the delayed representation.

18. The method of claim 14, further comprising precorrecting the digital input signal to mitigate attenuation introduced by filtering the summed analog signal.

19. The method of claim 14, the second word size being a one-bit word.

20. The method of claim 14, further comprising delaying the summed analog signal to form a second delayed representation and adding the summed analog signal to the second delayed representation.

21. A digital-to-analog converter assembly, comprising:
    means for converting a digital signal to an analog signal, the means for converting having an associated high dynamic range frequency band; and
    means for providing attenuating nulls within the analog signal at periodic center frequencies associated with the boundaries of the high dynamic range band, the means for providing attenuating nulls comprising means for summing the analog signal with a delayed representation of the analog signal.

22. The assembly of claim 21, further comprising a means for attenuating noise at frequencies outside of the high dynamic range frequency band.

23. The assembly of claim 21, further comprising means for precorrecting the digital signal to mitigate attenuation of at least one signal of interest.

24. The assembly of claim 21, the means for converting having a plurality of contiguous high dynamic range frequency bands, the means for providing attenuation providing attenuation at the boundaries between the contiguous frequency bands.

25. The assembly of claim 21, further comprising means for changing a shape associated with the high dynamic range frequency band.

26. The assembly of claim 21, further comprising means for changing a center frequency associated with the high dynamic range frequency band.

* * * * *